(12) United States Patent
Heuermann (10) Patent No.: US 9,106,154 B2
(45) Date of Patent: Aug. 11, 2015

(54) POWER CONVERTER SYSTEM USING VOLTAGE SOURCES DRIVEN IN ALTERNATION

(75) Inventor: Oliver Heuermann, Hemhofen (DE)

(73) Assignee: Siemens Aktiengesellschaft, München (DE)

( * ) Notice: Subject to any disclaimer, the term of this patent is extended or adjusted under 35 U.S.C. 154(b) by 699 days.

(21) Appl. No.: 13/361,744

(22) Filed: Jan. 30, 2012

(65) Prior Publication Data

US 2012/0193992 A1 Aug. 2, 2012

(30) Foreign Application Priority Data

Feb. 2, 2011 (DE) .................... 10 2011 003 526

(51) Int. Cl.
*H02M 7/483* (2007.01)
*G01R 33/385* (2006.01)
*H02M 7/217* (2006.01)

(52) U.S. Cl.
CPC ........... *H02M 7/483* (2013.01); *G01R 33/3852* (2013.01); *H02M 7/217* (2013.01)

(58) Field of Classification Search
None
See application file for complete search history.

(56) References Cited

U.S. PATENT DOCUMENTS

| | | | | |
|---|---|---|---|---|
| 2,849,614 A | * | 8/1958 | Royer et al. | 331/113 A |
| 3,062,974 A | | 11/1962 | Johnson | |
| 3,505,540 A | * | 4/1970 | Ferrari | 327/111 |
| 3,628,122 A | * | 12/1971 | Rodewald | 307/110 |
| 4,079,265 A | * | 3/1978 | Woodburn | 307/108 |
| 5,311,067 A | * | 5/1994 | Grothaus et al. | 307/108 |
| 5,351,175 A | | 9/1994 | Blankenship | |
| 5,905,371 A | * | 5/1999 | Limpaecher | 323/288 |
| 6,956,748 B2 | | 10/2005 | Nakagawa | |
| 7,079,623 B2 | | 7/2006 | Heuft et al. | |
| 7,755,217 B2 | * | 7/2010 | Heuermann | 307/110 |

(Continued)

FOREIGN PATENT DOCUMENTS

| | | |
|---|---|---|
| CN | 1093961 A | 10/1994 |
| CN | 1998271 A | 7/2007 |

(Continued)

OTHER PUBLICATIONS

German Office Action dated Dec. 12, 2011 for corresponding German Patent Application No. DE 10 2011 003 526.5 with English translation.

(Continued)

*Primary Examiner* — Rexford Barnie
*Assistant Examiner* — David Shiao
(74) *Attorney, Agent, or Firm* — Lempia Summerfield Katz LLC (57) ABSTRACT

A power converter system includes a first unipolar voltage source that produces a first voltage and a second unipolar voltage source that produces a second voltage. The power converter system also includes a transformer with a first primary winding, a second primary winding, and a secondary winding, and control equipment. The first primary winding is connected to the first unipolar voltage source, and the second primary winding is connected to the second unipolar voltage source such that when the first voltage is applied, a first secondary voltage is induced in the secondary winding and that when the second voltage is applied, a second secondary voltage is induced. The first secondary voltage is directed in opposition to the second secondary voltage. The control equipment drives the first unipolar voltage source and the second unipolar voltage source in alternation for the production of the first voltage and the second voltage.

15 Claims, 11 Drawing Sheets

(56) References Cited

U.S. PATENT DOCUMENTS

2002/0158609 A1* 10/2002 Lavington et al. ............ 320/165
2008/0150370 A1   6/2008 Heuermann

FOREIGN PATENT DOCUMENTS

| | | |
|---|---|---|
| CN | 101534071 A | 9/2009 |
| CN | 101702578 A | 5/2010 |
| DE | 33 10558 A1 | 10/1984 |
| DE | 10 2004 001 782 A1 | 8/2005 |
| DE | 10 2006 060 417 B4 | 9/2008 |
| EP | 0 547 006 A1 | 6/1993 |
| JP | 4008177 | 1/1992 |
| JP | 2004-201482 A | 7/2004 |

OTHER PUBLICATIONS

Chinese Office Action in corresponding Chinese Patent Application No. 201210022171.5 dated Mar. 25, 2015, with English translation.

* cited by examiner

POWER CONVERTER SYSTEM USING VOLTAGE SOURCES DRIVEN IN ALTERNATION

This application claims the benefit of DE 10 2011 003 526.5, filed on Feb. 2, 2011.

BACKGROUND

The present embodiments relate to a power converter system.

In the case of medical investigation equipment such as, for example, a system for X-ray diagnosis or a magnetic resonance (MR) system, high voltages may be required for the generation of X-ray beams or electromagnetic fields. For example, in the case of X-ray equipment for baggage, freight or material checking, or in the case of tests on materials, high voltages are required. The power of the high voltage required lies in the range from a few kW up to over 100 kW, for example. In the case of computer tomography (CT) approximately 120-150 kW are required, for example. For angiography X-ray equipment (AX), approximately 80-100 kW may be required. For mammography investigation equipment, approximately 5 kW may be required, and in the case of an X-ray scanner for baggage checking, approximately 40-60 kW may be required.

Figure 1:
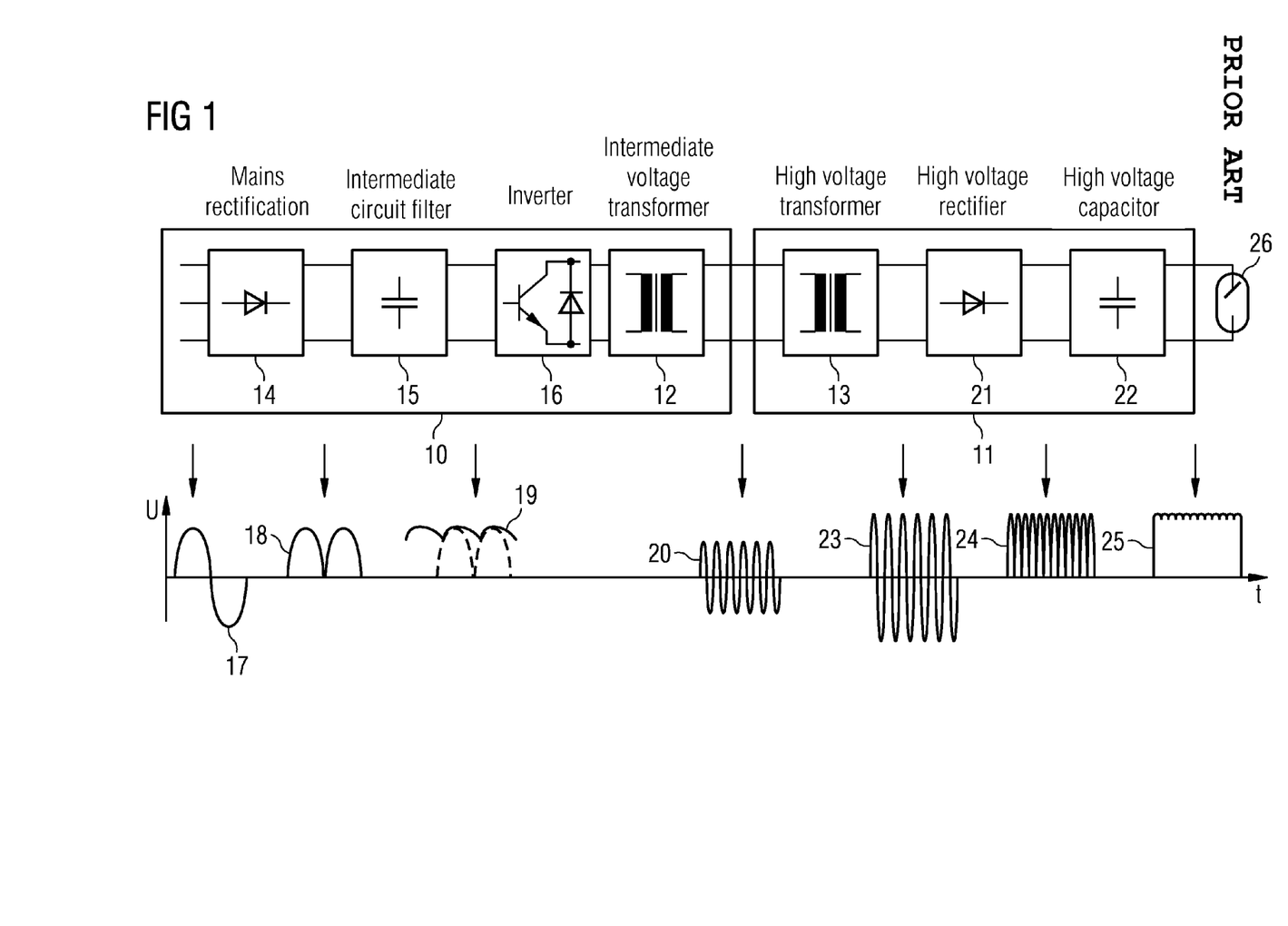
FIG. 1 shows a block diagram of the production of high voltage in accordance with the prior art.

FIG. 1 shows a block diagram of the generation of a high voltage (e.g., for a computer tomograph). In a first stage 10, an intermediate voltage 20 is produced from a mains power supply 17 (e.g., a 400V three-phase supply). The first stage 10 incorporates a mains rectifier 14, an intermediate circuit filter 15, an inverter 16, and an intermediate voltage transformer 12. From the alternating current input 17, a DC voltage 18 is produced using the mains rectifier 14. The DC voltage 18 is smoothed by the intermediate circuit filter 15 so that a smoothed voltage 19 is available for the inverter 16. The inverter 16 produces an alternating voltage with a significantly higher frequency than the frequency of the input voltage 17, and feeds the produced alternating voltage to the intermediate voltage transformer 12. In the intermediate voltage transformer 12, the alternating voltage is transformed, for example, to approximately 2000V. This intermediate voltage 20 is fed into a second stage 11. The second stage 11 includes a high-voltage transformer 13, a high-voltage rectifier 21, and a high-voltage capacitor 22. The high-voltage transformer 13 transforms the intermediate voltage 20 to a desired high voltage 23 of some thousands of volts. From this, the high-voltage rectifier 21 produces a DC voltage 24, from which a smoothed high voltage 25 is produced (e.g., for an X-ray tube 26) with the help of the high-voltage capacitor 22. This type of high voltage production requires high-cost semiconductor switches with high voltage strength and large and expensive transformers. The semiconductor switches may be realized, for example, by bipolar transistors with insulated gate electrodes (e.g., IGBTs).

In magnetic resonance systems, use is also made, for example, of cascade inverters (e.g., as is disclosed in DE 102006060417 B4). In the cascade inverter, the required current handling capacity is achieved by connecting IGBTs in parallel. However, a comparatively larger and more expensive transformer is provided with n-fold secondary windings in order to produce the galvanically separated supply voltages for the cascade cells.

Figure 2:
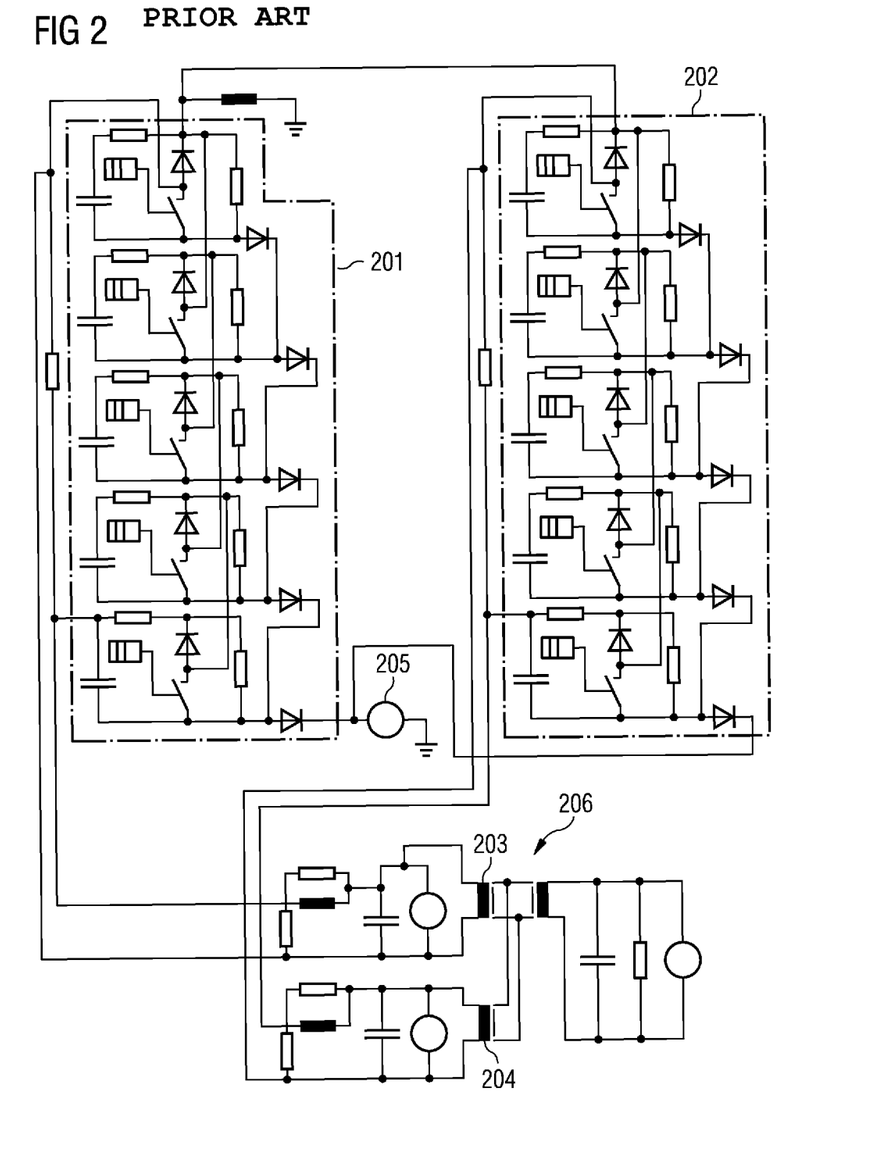
FIG. 2 shows a power modulator for the production of high voltage in accordance with the prior art.

From the field of oncology treatment systems, a circuit arrangement as shown in FIG. 2 is known. The circuit arrangement includes a power modulator and a transformer 206. The power modulator shown in FIG. 2, which includes two Marx generators 201 and 202, drives two primary transformer windings 203 and 204 in a common mode form of operation. From a supply voltage from a supply source 205, the Marx generators 201 and 202 produce an intermediate voltage that, with the help of the transformer 206, is transformed to a high voltage. Because the primary windings 203 and 204 of the transformer 206 are driven in a common mode form of operation, a demagnetization is provided. The Marx generator serves to produce transient voltage pulses of very short time duration and high amplitude. The Marx generator is based on the idea of using a DC voltage to charge up a large number of capacitors in parallel to the value of a stage voltage and to connect the capacitors in series. While the capacitors are connected in parallel and charging up, the charge currents add to each other. During the subsequent series connection, the voltages across the capacitors add to each other.

SUMMARY AND DESCRIPTION

In the conventional production of the required high voltages, there is a requirement for semiconductor switches with a high voltage strength together with large transformers with numerous secondary windings. These components are costly and demand a large installation space.

The present embodiments may obviate one or more of the drawbacks or limitations in the related art. For example, an economically and compactly realized electric circuit that provides a high voltage and a high current is provided.

In one embodiment, a power converter system includes a first unipolar voltage source for the production of a first voltage and a second unipolar voltage source for the production of a second voltage. The power converter system includes a transformer having a first primary winding, a second primary winding and a secondary winding. The first primary winding is connected to the first voltage source, and the second primary winding is connected to the second voltage source such that when the first voltage is applied, a first secondary voltage is induced in the secondary winding, and when the second voltage is applied, a second secondary voltage is induced in the secondary winding. The first secondary voltage is directed in opposition to the second secondary voltage. Control equipment for the power converter system drives the first voltage source and the second voltage source essentially in alternation for the production of the first voltage and the second voltage. Accordingly, the transformer is driven with the help of the first voltage source and the second voltage source in a push-pull mode of operation. The control equipment may, for example, drive the first voltage source and the second voltage source such that at any point in time, only the first voltage, only the second voltage, or no voltage at all is produced. Hence, only the first voltage, only the second voltage, or no voltage at all is applied to the transformer. The first voltage source may include a first Marx generator that is arranged to make the first voltage available at an output of the first Marx generator. The second voltage source may include a second Marx generator that is arranged to make the second voltage available at an output of the second Marx generator. By the use of Marx generators for the production of the first voltage and the second voltage, the production of an intermediate voltage for the first stage shown in FIG. 1 may be effected without an intermediate voltage transformer, so that the intermediate voltage transformer may be dispensed with. By the use of two galvanically separated primary windings, the two Marx generators may be supplied with energy from a common power supply, so that no galvanic separation of the input sides of the Marx generators is necessary.

In one embodiment, the first Marx generator and the second Marx generator each include several stages. One stage includes a charge store and a switching element for switching over between a charging mode of operation for the stage, and a discharge mode of operation for the stage. The charge store may include, for example, a capacitor and a switching element (e.g., a semiconductor switch such as an IGBT, a semiconductor switch using SIC technology or a MOSFET). In the case of a Marx generator, the maximum voltage that is applied across each switching element is the supply voltage for the Marx generator. Accordingly, the switching elements may have a comparatively low voltage strength. If, for example, the Marx generator is operated with a supply voltage of 400V, an appropriate voltage strength for the switching elements may be around 500-600V. However, the output voltage of the Marx generator, which corresponds to the first voltage or the second voltage, as applicable, may extend to a multiple of the supply voltage that depends on how many stages there are in the Marx generator concerned (e.g., a Marx generator with five stages may produce an output voltage of 2,000V from an input voltage of 400V).

In one embodiment, the power converter system includes a first diode that is arranged in the forwards direction for a first voltage between the first voltage source and the first primary winding, and a second diode that is arranged in the forwards direction for a second voltage between the second voltage source and the second primary winding. Using the two diodes, the two voltage sources (e.g., the two Marx generators) are separated from each other such that reactions through the transformer from one of the two voltage sources to the other of the two voltage sources are suppressed. Reliable operation of the voltage sources (e.g., when the Marx generators are used as voltage sources) is thus provided.

In one embodiment, every stage of the first or second Marx generators is in the form of a separate assembly. The assemblies of the stages are of the same design. By using modular assemblies of this type, Marx generators for the desired voltage and current capacity may be constructed by a suitable combination of several assemblies, connected in series and/or in parallel. For appropriate quantities, the assemblies may be cost-effectively manufactured and in a repair situation, are simple to replace.

In another embodiment, a stage includes a charging current circuit with a resistive element. The resistive element has a resistance with a positive temperature coefficient. The resistive element serves as a suppressor circuit for the stage of the Marx generator in the event of a failure (e.g., a short circuit) of the switching element for the stage. For example, in the event of a short circuit of the switching element for a stage, the resistive element that has become hot due to the short circuit reduces or interrupts the charging mode current flow of the stage affected. The fraction of the overall voltage of the Marx generator due to the voltage from the stage concerned will be lacking, but the remaining stages of the Marx generator may continue to provide a reduced overall Marx generator voltage even despite the failed stage. Accordingly, a high availability of the Marx generator may be provided even in the event of a failure of individual stages of the Marx generator.

In one embodiment, the control equipment is arranged such that the switching elements of the stages of the Marx generators are driven independently of each other. The first voltage and the second voltage each have one of several voltage levels depending on how the first voltage and the second voltage are driven. By alternate driving of the first voltage source and the second voltage source, an alternating current (e.g., a zero-mean alternating current) may be fed into the primary windings of the transformer. The first voltage and the second voltage are driven such that each of the first voltage and the second voltage has one of several voltage levels, so, for example, a sinusoidal voltage waveform for the alternating voltage on the primary side of the transformer may be approximated. The energy transfer through the transformer may thus be improved, and a favorable power factor may be adjusted for.

In another embodiment, each of the Marx generators has, at each power supply input, a charging switch. The charging switch is driven by the control equipment such that the charging switch limits the charging current to the Marx generator at the input concerned. The charging switch may, for example, be driven cyclically during a charging operation for the individual stages of the Marx generator (e.g., in a chopper mode). A charging choke that is conventionally provided at the supply voltage inputs to Marx generators may thus be eliminated. While the Marx generator capacitors are connected in series and being discharged, the charging switch may be opened in order to protect the supply voltage input against reactions from within the Marx generator. The charging time of the Marx generator may be shortened with the help of the charging switch, and any magnetostriction may be reduced. Accordingly, noise generation from the power converter system may be reduced.

In accordance with the present embodiments, medical investigation equipment with a power converter system as described above is also provided. The medical investigation equipment may include investigation equipment for carrying out computer tomography, magnetic resonance tomography, or X-ray angiography. The secondary winding of the transformer may, for example, be connected to an X-ray tube for the generation of X-ray beams or to a magnetic coil for the creation of a gradient field.

The power converter system may also be used in other areas. For example, the power converter system may be used in X-ray systems for luggage screening or material testing.

DETAILED DESCRIPTION OF THE DRAWINGS

Figure 3:
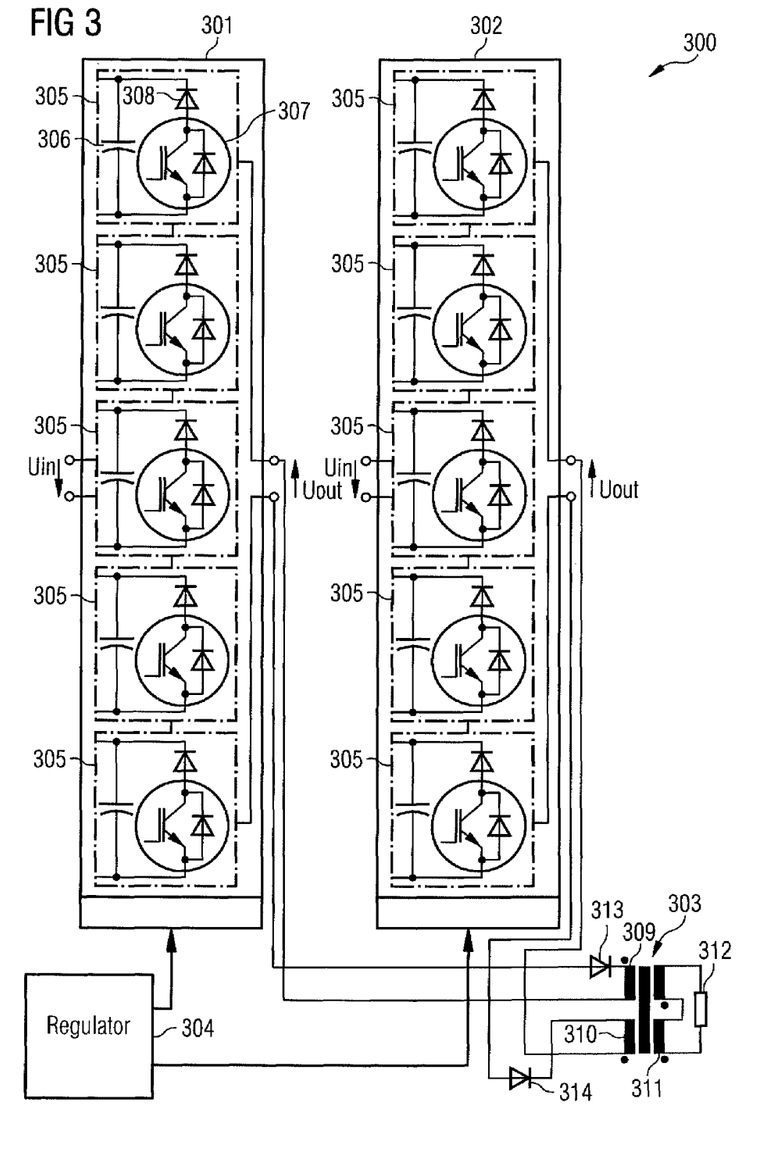
FIG. 3 shows one embodiment of a power converter.

FIG. 3 shows one embodiment of a power system converter 300 with a first Marx generator 301 and a second Marx generator 302 (e.g., two Marx generators), a transformer 303, and a regulator or control equipment 304. Each of the two Marx generators 301 and 302 includes five stages 305 with the same type of design. Each of the stages 305 includes a charge capacitor 306, a switching element 307, and other components such as, for example, a diode 308. The switching elements 307 may, for example, include insulated gate bipolar transistors (IGBTs), metal-oxide-semiconductor field-effect transistors (MOSFETs), or SiC transistors. The five stages 305 of each of the two Marx generators 301 or 302 are arranged and connected together such that the charge capacitors 306 are charged up when a voltage $U_{in}$ is applied across inputs of the corresponding Marx generator 301 or 302, with the switching elements 307 open. When the switching elements 307 are closed, a series connection of voltages across the charge capacitors 306 is available as an output voltage $U_{out}$ at an output of the corresponding Marx generator 301 or 302. In FIG. 3, the interconnection of the individual stages 305 with each other and the interconnection of the components within the stages 305 is only shown schematically. The input voltage $U_{in}$ to the Marx generators 301, 302 may, for example, be 400 Volts. The input voltage may be obtained from a conventional three-phase alternating current with the help of a rectifier. The charging capacitors 306 are each charged up to 400 Volts and, when the charging capacitors 306 are connected in series with the help of the switching elements 307, the charging capacitors 306 produce an output voltage $U_{out}$ of approximately 2000 Volts. Control of the switching elements 307 is effected by the regulator 304 that, apart from timing regulation, may also have a current regulation and load regulation function. The regulator 304 may be connected to the switching elements 306 using fiber-optic links, for example. Since each of the switching elements 307 in the example cited above switch a maximum voltage of 400 Volts, appropriately dimensioned switching elements that, when a safety margin is included, have a voltage strength of 600 to 800 Volts, for example, may be used. Since the stages 305 are all essentially of the same design, the stages 305 may be configured as standard or unit modules, an appropriate number of which may be used in the Marx generators 301 and 302 according to the desired output voltage $U_{out}$. Accordingly, the two Marx generators 301, 302 may be cost effective to manufacture.

Figure 6:
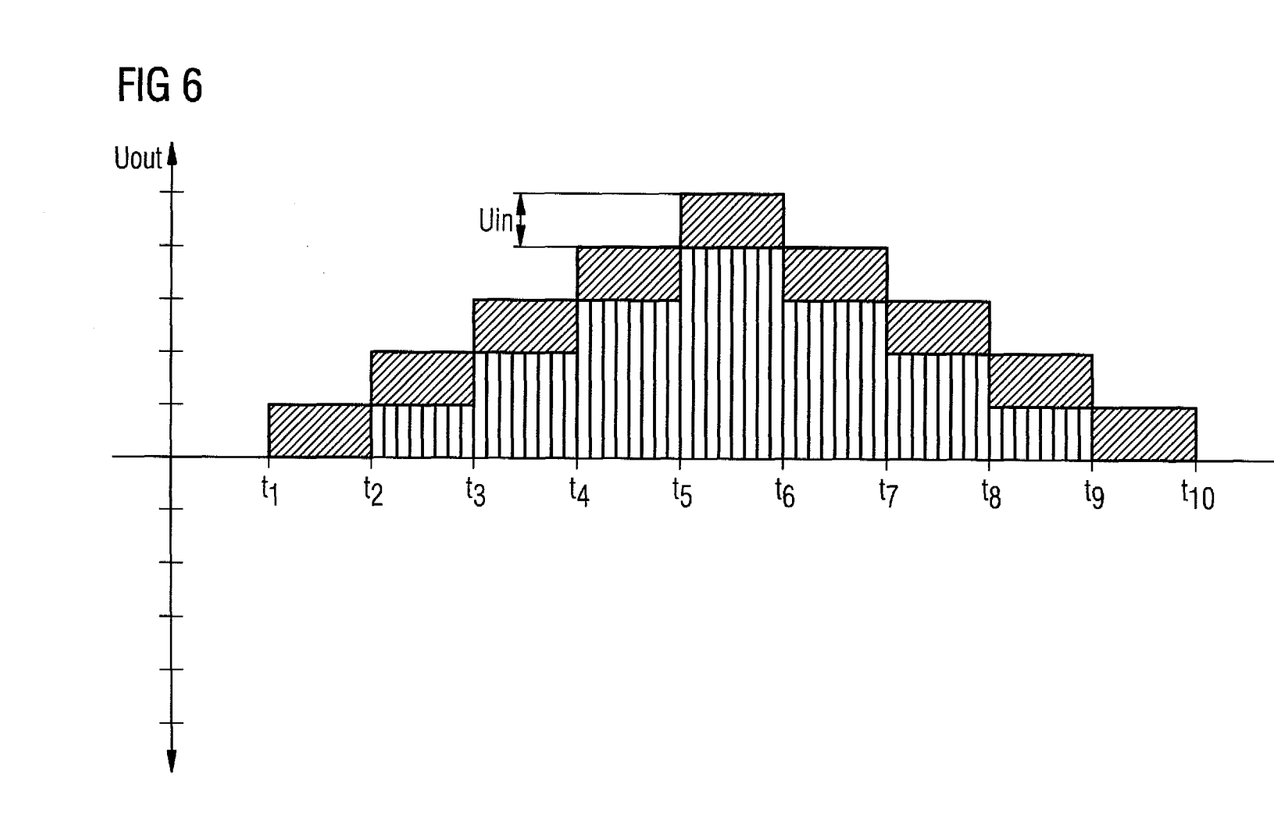
FIG. 6 shows example voltage levels of the Marx generator in FIG. 5 during multi-level operation of the Marx generator.
Figure 7:
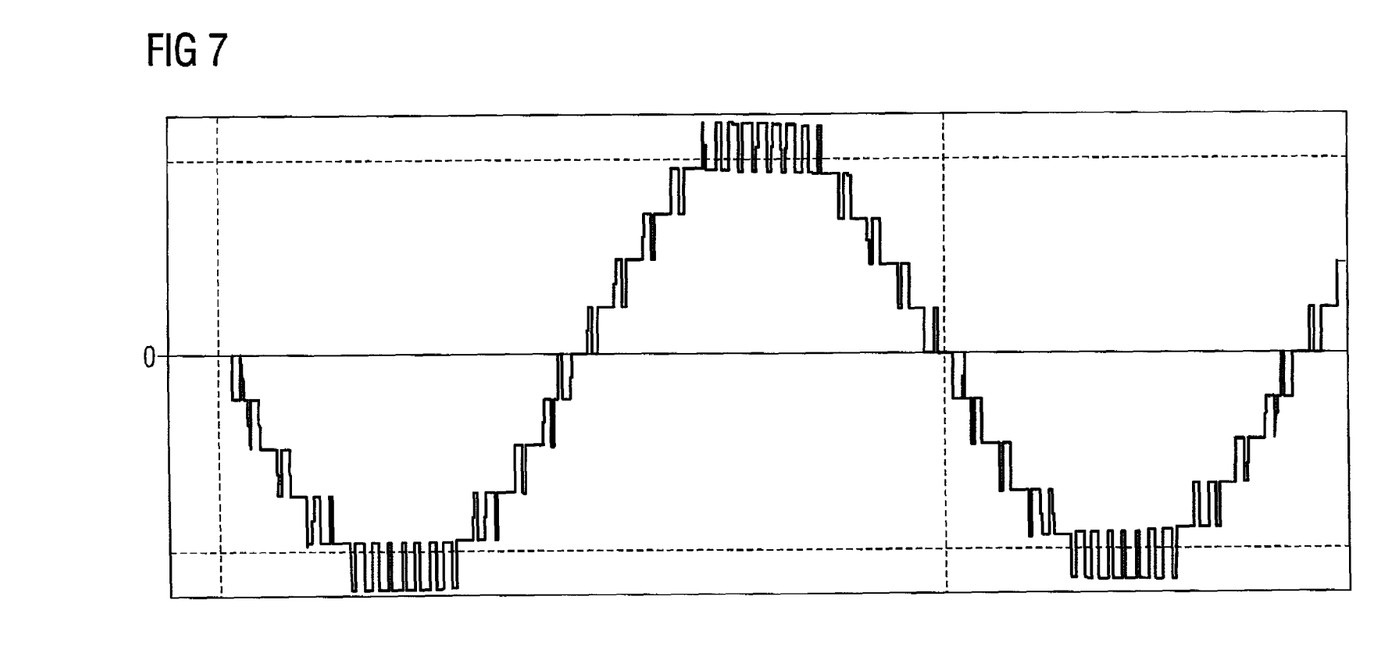
FIG. 7 shows an example voltage waveform at the output from the Marx generators in the power converter system of FIG. 3.
Figure 9:
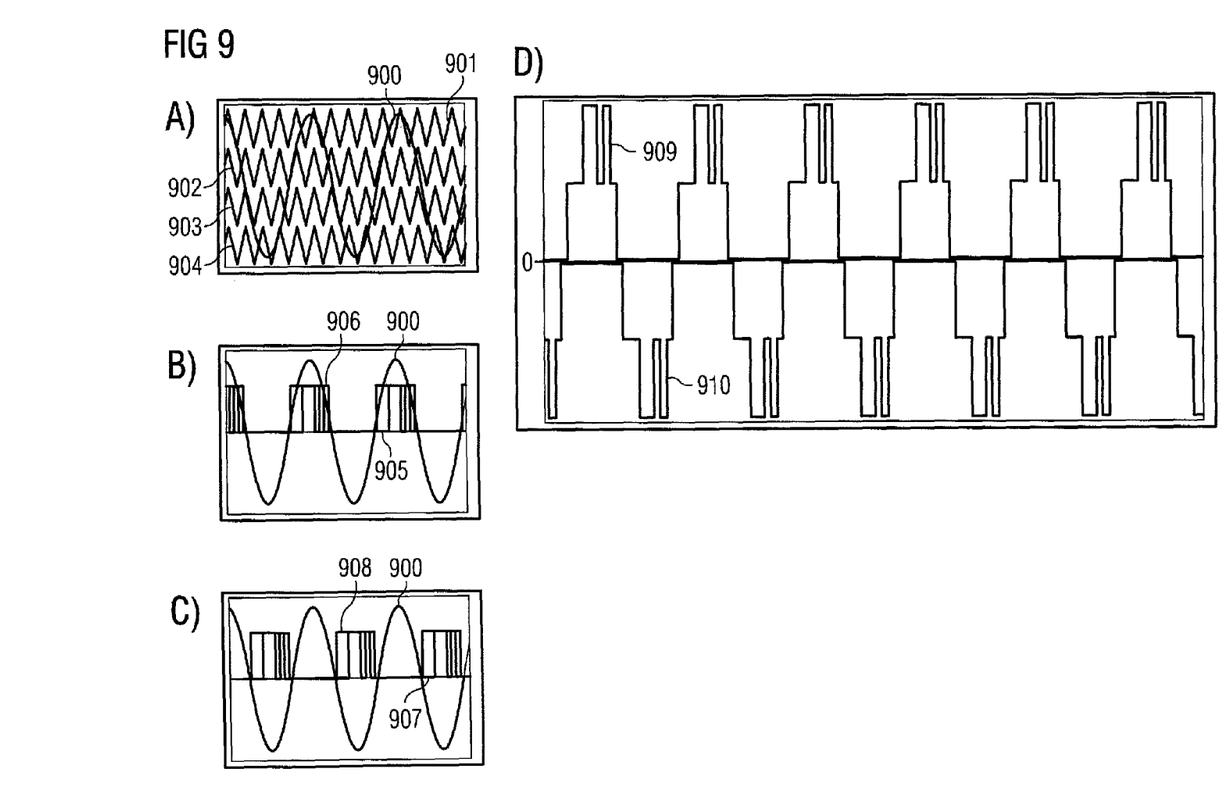
FIG. 9 shows example voltage waveforms for the power converter system in FIG. 8.

Due to the structure of the two Marx generators 301, 302, the output voltage $U_{out}$ is unipolar (e.g., the Marx generator 301, 302 may only produce a voltage such as 0 Volts, 2000 Volts, or a multiple of 400 Volts, as applicable, with one polarity if only an appropriate subset of the switching elements 307 are switched through). The output voltage $U_{out}$ of the first Marx generator 301 is connected to a first primary winding 309 of the transformer 303 via a diode 313. The output voltage $U_{out}$ of the second Marx generator 302 is connected to a second primary winding 310 of the transformer 303 via a diode 314. The secondary winding 311 of the transformer 303 is connected to a load 312. The two Marx generators 301 and 302 are connected to the transformer 303 such that when the output voltage $U_{out}$ is being output from the first Marx generator 301, a first current is induced in the secondary winding 311, and when the output voltage $U_{out}$ from the second Marx generator 302 is being applied, a second current is induced in the secondary winding 311. The second current is in opposition to the first current. The two Marx generators 301 and 302 thus drive the transformer 303 in a push-pull mode (e.g., an alternating voltage is produced on the primary side 309, 310). The diodes 313 and 314 provide that the first Marx generator 301 does not induce a voltage into the second Marx generator 302 via the transformer 303, and vice versa. The regulator 304 drives the two Marx generators 301 and 302 in alternation (e.g., so that an alternating current is injected into the primary side 309, 310 of the transformer 303). As shown in FIGS. 6, 7 and 9, the output voltages $U_{out}$ from the two Marx generators 301 and 302 may also be output in steps, so that a sinusoidal shaped alternating voltage waveform may be approximated on the primary side 309, 310 of the transformer 303.

Figure 4:
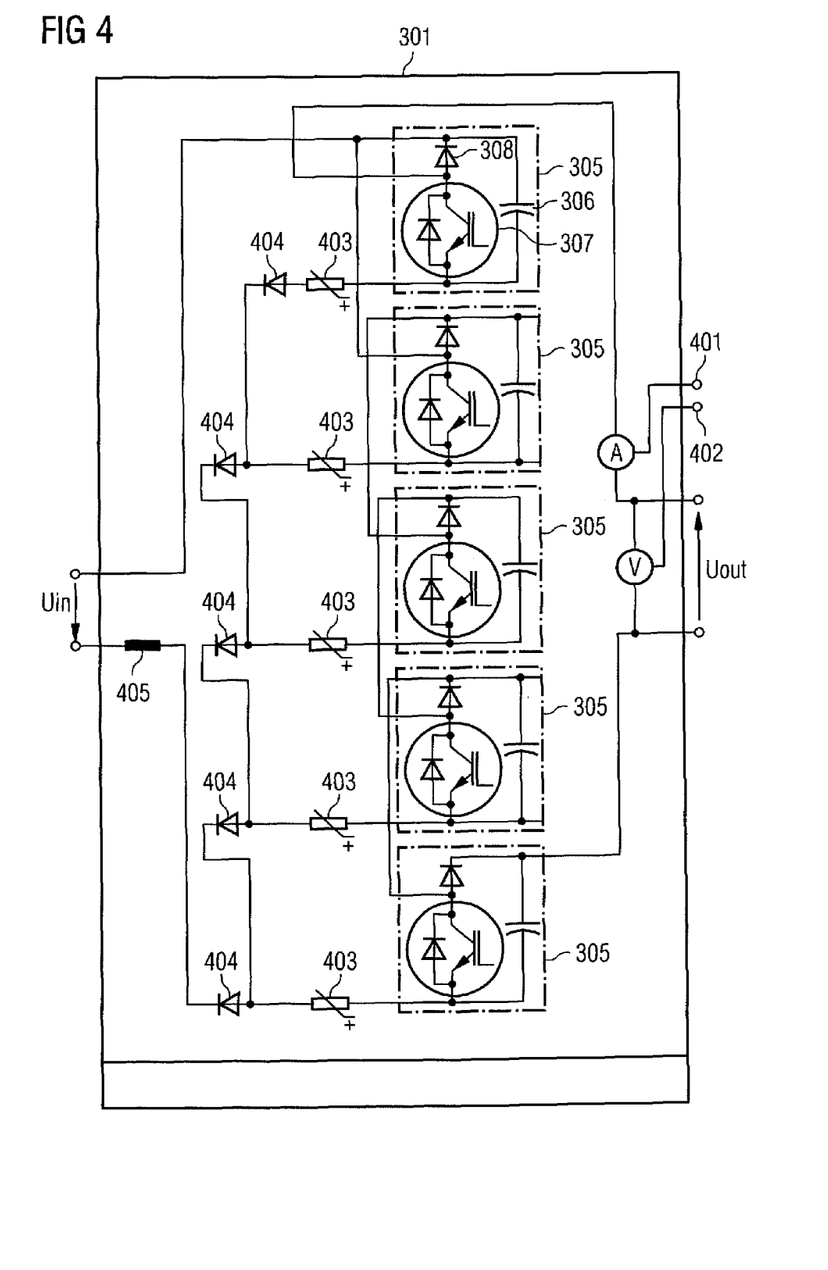
FIG. 4 shows one embodiment of a Marx generator in the power converter system shown in FIG. 3.

FIG. 4 shows a more detailed diagram of the first Marx generator 301. The second Marx generator 302 in FIG. 3 is constructed in a comparable way to the first Marx generator 301 described below. The first Marx generator 301 incorporates five stages 305, each of which includes a charge capacitor 306, a switching element 307 and a diode 308. In the embodiment shown in FIG. 4, the switching element 307 is an IGBT but may alternatively be a MOSFET or an SiC transistor, for example. The individual stages 305 are connected to each other via diodes 404, as shown in FIG. 4. Depending on switch settings of the switching elements 307, the charge capacitors 306 may be connected in parallel and be charged up with the input voltage $U_{in}$ or may be connected in series and output the output voltage $U_{out}$. The first Marx generator 301 may, in addition, have test connections 401 and 402 in order to be able to measure a present output current at the connection 401 and a present output voltage at the connection 402. The output voltage and the output current may, for example, be fed to the regulator 304 in FIG. 3, which drives the control elements 307 of the two Marx generators 301 or 302, as appropriate, as a function of the measured values that have been detected. The first Marx generator 301 also includes resistors 403 with a positive temperature coefficient (e.g., PTC resistors) that serve as cell protection circuitry. If one or more stages 305 fail (e.g., due to a short circuit in the switching element 307 in the stage concerned), a high charging current flows continuously through the corresponding PTC resistor 403. As a result, the resistance of the PTC resistor 403 increases and effectively prevents a further charging of the charge capacitor 306 of the stage 305 concerned. The resistance of the PTC resistor 403, however, also provides that the undamaged stages may continue to be operated. The circuitry shown in FIG. 4 thus provides that only the affected stage, which, for example, includes the short-circuited switching element 307, is essentially isolated, and the charging paths of the remaining stages 305 continue to work. The first Marx generator 301 also includes a charging choke 405 that limits charging current charging the charge capacitors 306.

Figure 5:
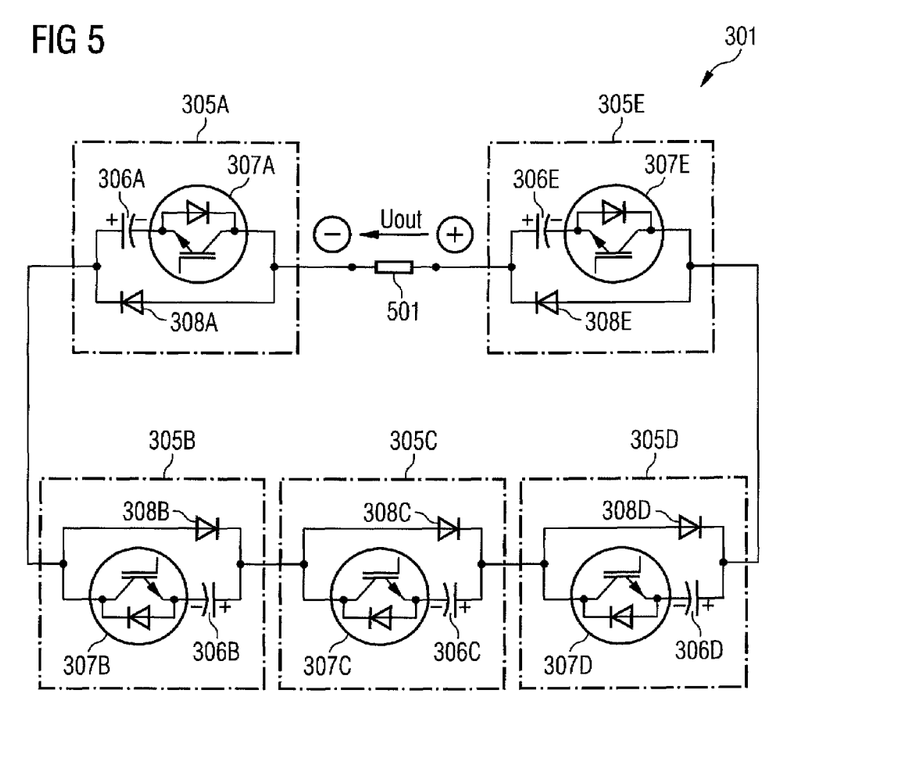
FIG. 5 shows one embodiment of the Marx generator from FIG. 4 in the discharge mode of operation.

FIG. 5 shows the stages 305 of the first Marx generator 301 in FIG. 3, redrawn in a form for the discharge cycle. For the purpose of distinguishing between the five stages, reference marks are supplemented with the letters A-E. In FIG. 5, only those components of the stages 305 that are relevant for the discharge cycle are shown. The components include the charge capacitor 306, the switching element 307, and the diode 308. When all the capacitors 306A-306E are charged up and the switching elements 307A-307E have been switched through, the diodes 308A-308E are in a blocking state, and the output voltage $U_{out}$ is applied across a load 501. The load 501 may, for example, be the primary winding 309, 310 in FIG. 3.

In the event of a failure of one of the switching elements 307 (e.g., if there is a short circuit of the switching element 307C), the corresponding charge capacitor 306C will no longer be charged up in the charging cycle. In the discharge cycle, therefore, the current powered by the remaining stages 305A, 305B, 305D and 305E continues to flow through stage 305C, past the capacitor 306C via the diode 308C, so that a reduced discharge voltage $U_{out}$ may be provided to the load 501. Thus, even in the case of the failure of a switching element in a stage (e.g., the switching element 307C), operation of the first Marx generator 301 continues to be possible at a reduced power level.

By selectively driving the control elements 307A-307E, the output voltage $U_{out}$ may be adjusted in steps or levels. If, for example, the switching elements 307A and 307C-307E are switched through, and the switching element 307B is not switched through, then the discharge current flows through the diode 308B, and the capacitor 306B does not contribute to the output voltage U.

FIG. 6 shows the output voltage $U_{out}$ when the Marx generator 301 is driven in the multi-level mode described above, in which the individual stages 305A-30SE are driven with a time offset in order to realize as good an approximation as possible to a sinusoidal waveform, for example. The first Marx generator 301 with five stages, shown in FIG. 5, may, for example, with an input voltage $U_{in}$ of 400 Volts, optionally provide output voltages of 0, 400, 800, 1,200, 1,600 or 2,000 Volts, in that none or one to five of the switching elements 307 are switched through. FIG. 6 shows a possible voltage waveform at the output from the first Marx generator 301. Up to the time point $t_1$, none of the switching elements 307 are switched through. From the time point $t_1$, one of the switching elements 307 is switched through. From $t_2$, two switching elements 307 are switched through, and so on. From $t_6$, fewer of the switching elements 307 are again switched through (e.g., from $t_6$, only four of the switching elements 307 are switched through, from $t_7$, only three, and so on). In addition, the switching elements 307 may be switched in and out cyclically, where the frequency may be chosen to be different for the individual switching elements 307. In FIG. 6, the cyclical switching of the switching elements 307 is represented by differences in hatching. For example, between $t_3$ and $t_4$, two switching elements 307 have a slow cycle (e.g., broad hatching), and one switching element 307 has a high frequency cycle (e.g., narrow hatching). Using the cycle frequency setting and an associated pulse width modulation, a sinusoidal waveform may be more closely approximated for the overall voltage. For example, in conjunction with a sine-triangle modulation, a sinusoidal voltage waveform may be impressed on the primary winding 309, 310, and hence, a sinusoidal current as desired. The demagnetization of the transformer 303 is effected by the currents in the opposite direction in the primary windings 309 and 310. FIG. 7 shows a pulse width modulated signal produced using sine-triangle modulation. In doing this, a sinusoidal signal with a frequency of 2 kHz and a triangular signal with a frequency of 100 kHz, for example, are used. Positive portions of the voltage are generated, for example, by the first Marx generator 301, and negative portions of the voltage are generated, for example, by the second Marx generator 302.

Figure 8:
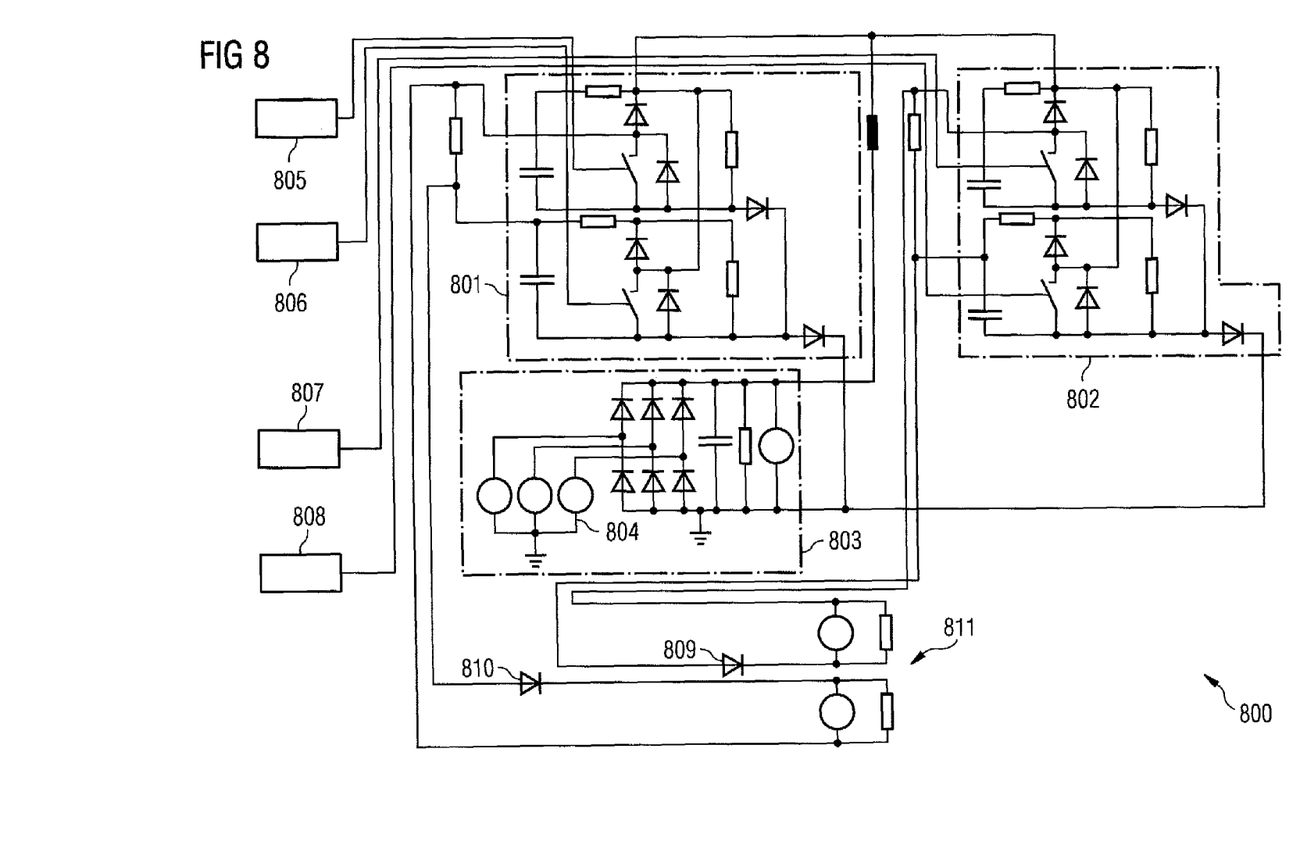
FIG. 8 shows one embodiment of a power converter system.

FIG. 8 shows another embodiment of a power converter system 800 with two two-stage Marx generators 801 and 802. A voltage supply 803 provides an input voltage of, for example, 400 Volts to two Marx generators 801 and 802 from a three-phase alternating current supply 804. The power converter system 800 also includes four sine-triangle modulators for driving the four stages of the two Marx generators 801 and 802. A first sine-triangle modulator 805 drives a first stage of the Marx generator 801, and a second sine-triangle modulator 806 drives a second stage of the Marx generator 801. In the same way, sine-triangle modulators 807 and 808 drive the two stages of the Marx generator 802. Outputs from the two Marx generators 801 and 802 are connected via the diodes 809 or 810, respectively, with a load 811 (e.g., a transformer with two primary windings), as described above in conjunction with FIG. 3.

FIG. 9 shows various voltage waveforms for the power converter system in FIG. 8. FIG. 9A shows a sinusoidal signal 900 that is to be approximated as an input voltage to the load 811. Further, FIG. 9A shows signal waveforms 901-904 for triangular signals, each of which is used by a sine-triangle modulator 805-808. For example, the sine-triangle modulator 805 combines the sinusoidal signal 900 with the triangular signal 901 and produces the pulse width modulation signal 905 shown in FIG. 9B. The sine-triangle modulator 806 combines the sinusoidal signal 900 with the triangular signal 902. From the combined signal, the sine-triangle modulator 806 produces the pulse width modulation signal 906 shown in FIG. 9B. The sine-triangle modulator 807 combines the sinusoidal signal 900 with the triangular signal 903 and produces the pulse width modulation signal 907 in FIG. 9C. The sine-triangle modulator 808 combines the sinusoidal signal 900 with the triangular signal 904 and produces the pulse width modulation signal 908 in FIG. 9C. The pulse width modulation signals 905-908 are used to drive the individual stages of the two Marx generators 801 and 802. The signal waveform shown in FIG. 9D is produced at the load 811. The positive voltage components 909 in FIG. 9D are produced by the Marx generator 801, and the negative voltage components 910 are produced by the Marx generator 802. The two Marx generators 801 and 802 produce an output voltage with five different levels. By pulse width modulation of the output voltage, the sinusoidal waveform 900 may be relatively well approximated. For example, in the example shown in FIG. 9, a 20 kHz sinusoidal signal is combined with a 100 kHz triangular signal.

Figure 10:
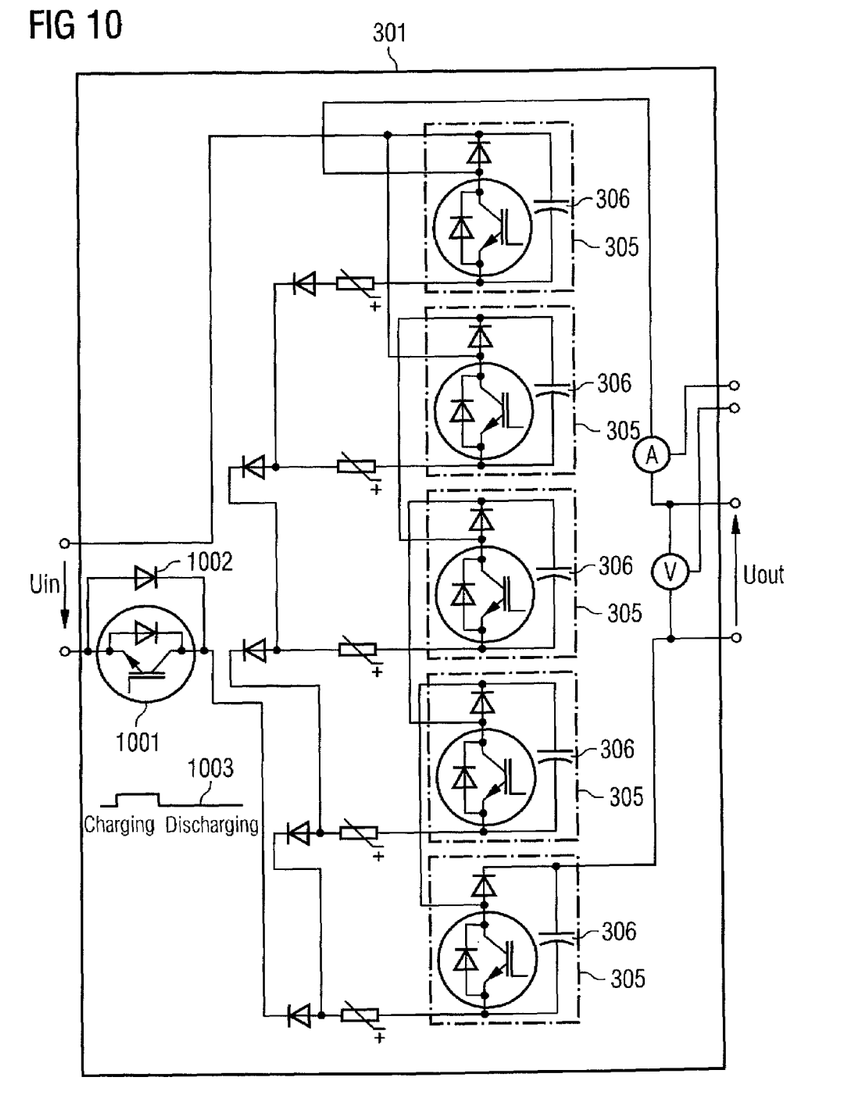
FIG. 10 shows one embodiment of a Marx generator for the power converter system in FIG. 3.

FIG. 10 shows yet another embodiment of a Marx generator 301 that is comparable in arrangement to the Marx generator 301 shown in FIG. 4. The Marx generator 301 shown in FIG. 10 has, instead of the charging choke 405 of the Marx generator 301 in FIG. 4, a switching element 1001 plus a diode 1002 connected in the no-load direction. The primary function of the charging choke 405 in FIG. 4 is to limit the rate of the current rise during the charging phase. A core of the charging choke 405, which is very rapidly magnetizable (e.g., made of SiFe 3%), generates noise disturbance due to magnetostriction. The noise disturbance is disadvantageous (e.g., in a clinical environment). In order to achieve the more rapid charging time that may be necessary for achieving the different switching frequencies, the switching element 1001 is used. The switching element 1001 includes, for example, a semiconductor switch that, when activated, feeds in the charging current for the charge capacitors 306 of the stages 305. In the discharge cycle of the Marx generator 301, the switching element 1001 is deactivated and thus is high-resistance. The switching element is configured for a blocking voltage at a level of the maximum output voltage $U_{out}$ minus the input voltage U. The switching element 1001 may, for example, include an IGBT or a SiC switch. The switching element 1001 is, as shown at 1003 in the diagram, activated during the charging of the charge capacitors 306 and deactivated during the discharge of the charge capacitors 306 in order to protect a power supply unit that provides the input voltage $U_{in}$ against reactions from the Marx generator 301. During the charging, the switching element 1001 may be driven in chopper mode, for example, with the help of pulse width modulation, where a charging current for the capacitors 306 is further limited. The use of the switching element 1001 may thus avoid disturbing noises from magnetostriction and may be cheaper than a corresponding charging choke.

Figure 11:
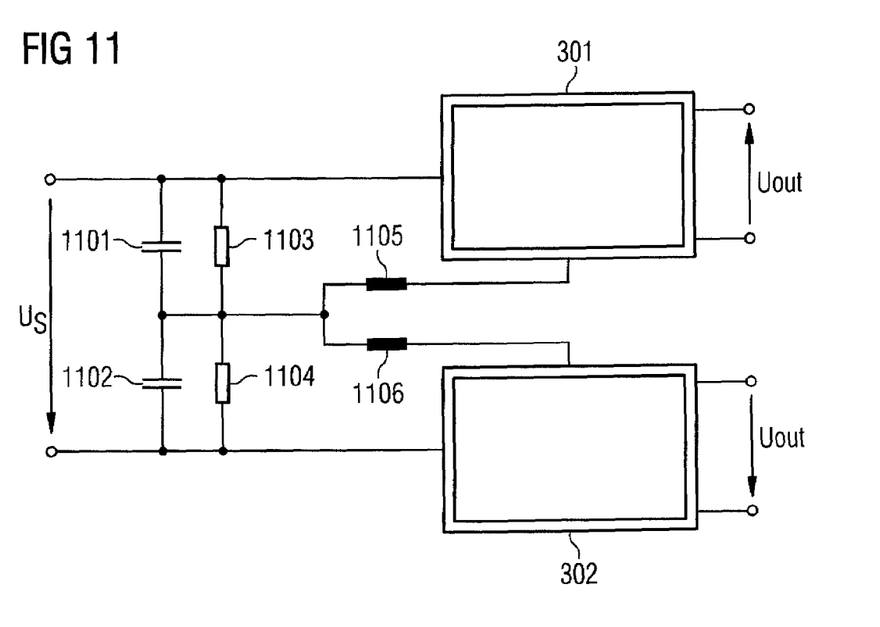
FIG. 11 shows one embodiment of a power supply for the power converter system in FIG. 3.

FIG. 11 shows a power supply for the two Marx generators 301 and 302, which work in a push-pull mode. An input DC voltage $U_S$ is split into two input voltages for the two Marx generators 301 and 302 using capacitors 1101 and 1102, resistors 1103 and 1104, and charging chokes 1105 and 1106. Depending on which stages of the Marx generators 301, 302 are used, two push-pull output voltages $U_{out}$ with a voltage level that is a multiple of $U_S$ are produced in a push-pull mode of operation.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A power converter system comprising:
   a first unipolar voltage source operable to produce a first voltage;
   a second unipolar voltage source operable to produce a second voltage;
   a first diode connected between the first unipolar voltage source and a first primary winding in a forward direction for the first voltage;
   a second diode connected between the second unipolar voltage source and a second primary winding in a forward direction for the second voltage;
   a transformer comprising:
      the first primary winding;
      the second primary winding; and
      a secondary winding, wherein the first primary winding is connected to the first unipolar voltage source, and the second primary winding is connected to the second unipolar voltage source such that when the first voltage is applied, a first secondary voltage is induced in the secondary winding and that when the second voltage is applied, a second secondary voltage is induced in the secondary winding, the first secondary voltage being in an opposite direction to the second secondary voltage; and
   control equipment operable to drive the first unipolar voltage source and the second unipolar voltage source in alternation such that the first voltage and the second voltage are produced,
   wherein the control equipment is operable to drive the first unipolar voltage source and the second unipolar voltage source such that at any point in time only the first voltage, only the second voltage, or no voltage is produced,
   wherein the first unipolar voltage source comprises a first Marx generator, the first Marx generator comprising a first output, the first Marx generator being arranged such that the first voltage is provided at the first output, and
   wherein the second unipolar voltage source comprises a second Marx generator, the second Marx generator comprising a second output, the second Marx generator being arranged such that the second voltage is provided at the second output.

2. The power converter system as claimed in claim 1, wherein the first Marx generator, the second Marx generator, or the first Marx generator and the second Marx generator each comprises a plurality of stages, and
   wherein at least one stage of the plurality of stages comprises a charge store and a switching element for switching between a charging mode for the at least one stage and a discharge mode for the at least one stage.

3. The power converter system as claimed in claim 2, wherein the switching element comprises a semiconductor switch.

4. The power converter system as claimed in claim 3, wherein each stage of the plurality of stages of the first Marx generator or the second Marx generator is made up of a separate module, wherein the separate modules of the plurality of stages have the same arrangement.

5. The power converter system as claimed in claim 2, wherein each stage of the plurality of stages of the first Marx generator or the second Marx generator is made up of a separate module, wherein the separate modules of the plurality of stages have the same arrangement.

6. The power converter system as claimed in claim 5, wherein a stage of the plurality of stages comprises, in a charging current circuit of the stage, a resistive element, and wherein the resistive element comprises a resistor with a positive temperature coefficient.

7. The power converter system as claimed in claim 2, wherein a stage of the plurality of stages comprises, in a charging current circuit of the stage, a resistive element, and wherein the resistive element comprises a resistor with a positive temperature coefficient.

8. The power converter system as claimed in claim 7, wherein the at least one stage comprises a plurality of stages, and
   wherein the control equipment is arranged such that the switching elements of the plurality of stages of the first Marx generator, the second Marx generator, or the first Marx generator and the second Marx generator are each driven independently of one another such that the first voltage and the second voltage each has one of several voltage levels depending on the driving.

9. The power converter system as claimed in claim 2, wherein the at least one stage comprises a plurality of stages, and
   wherein the control equipment is arranged such that the switching elements of the plurality of stages of the first Marx generator, the second Marx generator, or the first Marx generator and the second Marx generator are each driven independently of one another such that the first voltage and the second voltage each has one of several voltage levels depending on the driving.

10. The power converter system as claimed in claim 1, wherein the first Marx generator comprises a first input, and the second Marx generator comprises a second input, and
    wherein the first Marx generator comprises a first charging switch at the first input, and the second Marx generator comprises a second charging switch at the second input, the first charging switch and the second charging switch being drivable by the control equipment such that the first charging switch and the second charging switch limit a charging current at the first input and the second input, respectively.

11. Medical investigation equipment comprising:
    a power converter system comprising:
       a first unipolar voltage source operable to produce a first voltage;
       a second unipolar voltage source operable to produce a second voltage;
       a first diode connected between the first unipolar voltage source and a first primary winding in a forward direction for the first voltage;
       a second diode connected between the second unipolar voltage source and a second primary winding in a forward direction for the second voltage;
       a transformer comprising:

the first primary winding;
the second primary winding; and
a secondary winding, wherein the first primary winding is connected to the first unipolar voltage source, and the second primary winding is connected to the second unipolar voltage source such that when the first voltage is applied, a first secondary voltage is induced in the secondary winding and that when the second voltage is applied, a second secondary voltage is induced in the secondary winding, the first secondary voltage being in an opposite direction to the second secondary voltage; and
control equipment operable to drive the first unipolar voltage source and the second unipolar voltage source in alternation such that the first voltage and the second voltage are produced wherein the first unipolar voltage source comprises a first Marx generator, the first Marx generator comprising a first output, the first Marx generator being arranged such that the first voltage is provided at the first output, and
wherein the second unipolar voltage source comprises a second Marx generator, the second Marx generator comprising a second output, the second Marx generator being arranged such that the second voltage is provided at the second output.

12. The medical investigation equipment as claimed in claim 11, further comprising investigation equipment operable to carry out computer tomography, magnetic resonance tomography or X-ray angiography.

13. The medical investigation equipment as claimed in claim 12, further comprising an X-ray tube or a magnetic coil, wherein the secondary winding of the transformer is connected to the X-ray tube for the generation of X-ray beams or to a magnetic coil for the creation of a gradient field.

14. The medical investigation equipment as claimed in claim 11, further comprising an X-ray tube or a magnetic coil, wherein the secondary winding of the transformer is connected to the X-ray tube for the generation of X-ray beams or to a magnetic coil for the creation of a gradient field.

15. A method of using a power converter system for the production of a high voltage in medical investigation equipment, the power converter system comprising a first unipolar voltage source, a second unipolar voltage source, a first diode, a second diode, a transformer, and control equipment, the transformer comprising a first primary winding, a second primary winding, and a secondary winding, wherein the first primary winding is connected to the first unipolar voltage source and the second primary winding is connected to the second unipolar voltage source, the method comprising:
    producing a first voltage using the first unipolar voltage source, wherein the first diode is connected between the first unipolar voltage source and the first primary winding in a forward direction for the first voltage;
    producing a second voltage using the second unipolar voltage source, wherein the second diode is connected between the second unipolar voltage source and a second primary winding in a forward direction for the second voltage;
    inducing a first secondary voltage in the secondary winding when the first voltage is applied;
    inducing a second secondary voltage in the secondary winding when the second voltage is applied, the first secondary voltage being in an opposite direction to the second secondary voltage; and
    driving the first unipolar voltage source and the second unipolar voltage source essentially in alternation using the control equipment to produce the first voltage and the second voltage wherein the first unipolar voltage source comprises a first Marx generator, the first Marx generator comprising a first output, the first Marx generator being arranged such that the first voltage is provided at the first output, and
    wherein the second unipolar voltage source comprises a second Marx generator, the second Marx generator comprising a second output, the second Marx generator being arranged such that the second voltage is provided at the second output.

* * * * *